(12) United States Patent
Hamamoto et al.

(10) Patent No.: US 10,394,113 B2
(45) Date of Patent: Aug. 27, 2019

(54) REFLECTIVE MASK BLANK, REFLECTIVE MASK AND METHOD OF MANUFACTURING SEMICONDUCTOR DEVICE

(71) Applicant: HOYA CORPORATION, Shinjuku-ku (JP)

(72) Inventors: Kazuhiro Hamamoto, Shinjuku-ku (JP); Yohei Ikebe, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 110 days.

(21) Appl. No.: 15/539,263

(22) PCT Filed: Dec. 15, 2015

(86) PCT No.: PCT/JP2015/085020
§ 371 (c)(1),
(2) Date: Jun. 23, 2017

(87) PCT Pub. No.: WO2016/104239
PCT Pub. Date: Jun. 30, 2016

(65) Prior Publication Data
US 2018/0329285 A1    Nov. 15, 2018

(30) Foreign Application Priority Data
Dec. 24, 2014  (JP) .............................. 2014-260280

(51) Int. Cl.
| G03F 1/24 | (2012.01) |
| G03F 1/32 | (2012.01) |
| G03F 1/48 | (2012.01) |
| C03C 3/06 | (2006.01) |
| C03C 15/00 | (2006.01) |
| C03C 17/34 | (2006.01) |
| C03C 17/36 | (2006.01) |
| C03C 23/00 | (2006.01) |

(52) U.S. Cl.
CPC .............. *G03F 1/24* (2013.01); *C03C 3/06* (2013.01); *C03C 15/00* (2013.01); *C03C 17/3435* (2013.01); *C03C 17/3441* (2013.01); *C03C 17/3636* (2013.01); *C03C 23/0075* (2013.01); *G03F 1/32* (2013.01); *G03F 1/48* (2013.01); *C03C 2204/08* (2013.01)

(58) Field of Classification Search
CPC ................. G03F 1/24; G03F 1/32; G03F 1/48
USPC ............................................................ 430/5
See application file for complete search history.

(56) References Cited

U.S. PATENT DOCUMENTS

| 5,955,223 A | 9/1999 | Mitsui et al. |
| 2009/0220869 A1 | 3/2009 | Takai |
| 2015/0017574 A1 | 1/2015 | Orihara et al. |
| 2015/0331312 A1 | 11/2015 | Hamamoto et al. |
| 2016/0004153 A1 | 1/2016 | Shoki et al. |

FOREIGN PATENT DOCUMENTS

| JP | H11237727 | 8/1999 |
| JP | 2004207593 | 7/2004 |
| JP | 2009212220 | 9/2009 |
| JP | 2010080659 | 4/2010 |
| JP | 2014150124 A | 8/2014 |
| JP | 2014186333 | 10/2014 |
| WO | 2014129527 A1 | 8/2014 |
| WO | PCT/JP2015/085020 | 12/2015 |
| WO | WO 2014/104276 | 1/2017 |

OTHER PUBLICATIONS

JP2014-260280, "Office Action", dated Sep. 11, 2018, 5 pages.
International Search Report and Written Opinion were dated Mar. 1, 2016 by the International Searching Authority for International Application No. PCT/JP2015/085020, which was filed on Dec. 15, 2015 and published as WO 2016/104239 on Jun. 30, 2016 (Applicant—Hoya Corporation) (Original—7 pages/Translation—2 pages).
Office Action dated May 7, 2019, Taiwanese Application No. 104143235 (5 pp.).

*Primary Examiner* — Christopher G Young
(74) *Attorney, Agent, or Firm* — Kilpatrick Townsend & Stockton LLP

(57) ABSTRACT

An object of the present invention is to obtain a reflective mask blank capable of obtaining high contrast at the edges of a phase shift film pattern. Provided is a reflective mask blank comprising a multilayer reflective film and a phase shift film that shifts the phase of EUV light formed in that order on a substrate, wherein root mean square roughness (Rms), obtained by measuring a 1 μm×1 μm region on the surface of the phase shift film with an atomic force microscope, is not more than 0.50 nm, and power spectrum density at a spatial frequency of 10 to 100 μm$^{-1}$ is not more than 17 nm$^4$.

19 Claims, 3 Drawing Sheets

(a)

(b)

REFLECTIVE MASK BLANK, REFLECTIVE MASK AND METHOD OF MANUFACTURING SEMICONDUCTOR DEVICE

CROSS-REFERENCE TO RELATED APPLICATION

This application is a U.S. National Phase Application of International Application No. PCT/JP2015/085020, filed Dec. 15, 2015, which claims priority to Japanese Patent Application No. 2014-260280, filed Dec. 24, 2014. The contents of these earlier filed applications are hereby incorporated by reference herein in their entirety.

TECHNICAL FIELD

The present disclosure relates to a reflective mask blank and a reflective mask, which can be used to manufacture a highly integrated semiconductor device. In addition, the present disclosure relates to a method of manufacturing a semiconductor device using the reflective mask.

BACKGROUND ART

The exposure wavelength of the light sources of exposure apparatuses used to manufacture semiconductor devices is gradually becoming shorter in accommodation of increasingly higher levels of integration in the semiconductor industry. More specifically, exposure wavelengths are gradually becoming shorter in the manner of the g-line having a wavelength of 436 nm, i-line having a wavelength of 365 nm, KrF lasers having a wavelength of 248 nm and ArF lasers having a wavelength of 193 nm. Extreme ultraviolet (EUV) lithography has been proposed as an exposure technology that uses EUV light to enable the realization of finer pattern transfer. Here, EUV light refers to light in the wavelength band of the soft X-ray region or vacuum ultraviolet region. More specifically, EUV light refers to light having a wavelength of about 0.2 nm to 100 nm. Light having a wavelength in the vicinity of 13.5 nm can be used as EUV light.

Reflective masks are used in EUV lithography due to the small difference in absorptance with respect to EUV light between materials. Reflective masks have been proposed for use in EUV lithography that have a multilayer reflective film that reflects exposure light formed on a substrate, and a phase shift film that absorbs exposure light formed into a pattern on a protective film for protecting the multilayer reflective film. Light that has entered a reflective mask installed in an exposure apparatus is absorbed at the portion where the phase shift film pattern is present and is reflected by the multilayer reflective film at the portion where the phase shift film pattern is not present. As a result, a light image corresponding to the phase shift film pattern is transferred to a semiconductor substrate through the reflection optics. A portion of incident exposure light in the phase shift film pattern is reflected (phase-shifted) by a phase difference of about 180 degrees from light reflected by the multilayer reflective film. As a result, contrast is obtained between those portions where the phase shift film pattern is present and those portions where it is not.

Technologies relating to such reflective masks for EUV lithography and reflective mask blanks for the fabrication thereof have been disclosed in, for example, Patent Literature 1 to 3.

In addition, Patent Literature 4 discloses a phase shift mask blank having a light-semi-transmitting film on a transparent substrate, and the center line average roughness (defined in JIS B 0601 and indicated in nmRa) of the incident and emission surfaces of the light-semi-transmitting film with respect to exposure light is 0.1 to 50 nmRa.

PRIOR ART LITERATURE

Patent Literature

Patent Literature 1: JP 2004-207593A
Patent Literature 2: JP 2009-212220A
Patent Literature 3: JP 2010-080659A
Patent Literature 4: JP H11-237727A

SUMMARY

In the case of a reflective mask having a phase shift film for absorbing exposure light, image contrast is improved by light having a phase difference inverted in the vicinity of 180 degrees mutually interfering at the edges of the phase shift film pattern. Pattern transfer resolution also improves accompanying this improvement of image contrast.

A high level of absolute reflectance of the phase shift film with respect to EUV light is advantageous for obtaining high contrast at the edges of a phase shift film pattern. For example, absolute reflectance of a phase shift film with respect to EUV light can be designed to be 1% to 6%. However, in the case surface irregularities are present on the surface of the phase shift film, reflected light ends up scattering on the surface of the phase shift film, resulting in the problem of a decrease in absolute reflectance. Furthermore, in contrast to absolute reflectance, relative reflectance refers to the reflectance of a phase shift film with respect to EUV light based on absolute reflectance in the case EUV light has been reflected after entering a multilayer reflective film directly.

In addition, controlling surface irregularities in the surface of a phase shift film by simply employing a method comprising making the center line average roughness of the incident and emission surfaces of a light-semi-transmitting film relative to exposure light to be within a prescribed range as described in a method of the prior art such as Patent Literature 4 is inadequate for avoiding decreases in absolute reflectance as previously described.

Therefore, one aspect of the present disclosure is to allow the obtaining of a reflective mask capable of obtaining high contrast at the edges of a phase shift film pattern by allowing the obtaining of a phase shift film having high absolute reflectance within a prescribed range for which there is a small difference (shift) from the design value in the case of having designed such that the absolute reflectance of the phase shift film with respect to UV light is within a high prescribed range. In addition, another aspect of the disclosure is to allow the obtaining of a reflective mask blank capable of obtaining high contrast at the edges of a phase shift film pattern.

In addition, an aspect of the disclosure is to allow the obtaining of a method of manufacturing a semiconductor device having a fine and highly precise transfer pattern in which the dimensions of the circuit pattern or other transfer pattern transferred to a resist film formed on a transferred substrate such as a semiconductor are accurate.

As a result of conducting extensive studies to solve the aforementioned problems, the inventors of the present disclosure found that decreases in absolute reflectance of a phase shift film with respect to UV light as described above occur due to the effects of the roughness of prescribed spatial frequency (or spatial wavelength) components on the wavelength of EUV light. On the basis of this finding, the inventors of the present disclosure found that decreases in absolute reflectance of a phase shift film with respect to UV light as described above can be avoided by specifying the spatial frequencies of those roughness (surface irregularity) components on the surface of the phase shift film that affect decreases in absolute reflectance of the phase shift film with respect to UV light, and then managing amplitude intensity at that spatial frequency, thereby leading to completion of the present disclosure.

Furthermore, although efforts to reduce the surface roughness of reflective masks have been made in the past, the effect of the roughness of a prescribed spatial frequency (or spatial wavelength) component with respect to the wavelength of EUV light on decreases in absolute reflectance of a phase shift film with respect to UV light as described above has been completely unknown.

Therefore, the present disclosure employs the following configurations to solve the aforementioned problems. The present disclosure provides a reflective mask blank characterized by the following Configurations 1 to 4 and a reflective mask characterized by the following Configurations 5 to 8.

(Configuration 1)

A reflective mask blank comprising a multilayer reflective film and a phase shift film that shifts the phase of EUV light formed in that order on a substrate; wherein, root mean square roughness (Rms), obtained by measuring a 1 μm×1 μm region on the surface of the phase shift film with an atomic force microscope, is not more than 0.50 nm, and power spectrum density at a spatial frequency of 10 to 100 $\mu m^{-1}$ is not more than 17 $nm^4$.

According to Configuration 1 of the present disclosure, by making prescribed root mean square roughness (Rms) and power spectrum density at a prescribed spatial frequency to be within prescribed ranges in a phase shift film of a reflective mask blank, the reflective mask blank is able to have a phase shift film that has high absolute reflectance within a prescribed range for which there is a small difference (shift) from the design value in the case of having designed such that the absolute reflectance of the phase shift film with respect to UV light is within a high prescribed range. As a result, a reflective mask blank can be obtained for fabricating a reflective mask capable of obtaining high contrast at the edges of a phase shift film pattern.

(Configuration 2)

Configuration 2 of the present disclosure is the reflective mask blank described in Configuration 1 wherein a protective film is formed on the multilayer reflective film.

According to Configuration 2 of the present disclosure, damage to the surface of the multilayer reflective film when fabricating a transfer mask (EUV mask) can be inhibited as a result of the reflective mask blank having a protective film on the multilayer reflective film. Consequently, reflectance properties of a reflective mask fabricated using this reflective mask with respect to EUV light are further improved.

(Configuration 3)

Configuration 3 of the present disclosure is the reflective mask blank described in Configuration 1 or 2, wherein the phase shift film has a tantalum-based material layer comprising tantalum and nitrogen and a chromium-based material layer comprising chromium and nitrogen on the tantalum-based material layer.

According to Configuration 3 of the present disclosure, a phase shift film can be obtained having a prescribed phase shift effect and in which absolute reflectance with respect to UV light is high as a result of the phase shift film having a tantalum-based material layer comprising tantalum and nitrogen and a chromium-based material layer comprising chromium and nitrogen on the tantalum-based material layer.

(Configuration 4)

Configuration 4 of the present disclosure is the reflective mask blank described in Configuration 3, wherein the film thickness of the chromium-based material layer is 5 to 30 nm.

According to Configuration 4 of the present disclosure, an oxide layer (tantalum oxide layer) forming on the surface of the tantalum-based material layer can be prevented by making the film thickness of the chromium-based material layer covering the tantalum-based material layer to be within a prescribed range.

(Configuration 5)

Configuration 5 of the present disclosure is a reflective mask comprising a multilayer reflective film and a phase shift film pattern that shifts the phase of EUV light formed in that order on a substrate; wherein, root mean square roughness (Rms), obtained by measuring a 1 μm×1 μm region on the surface of the phase shift film pattern with an atomic force microscope, is not more than 0.50 nm, and power spectrum density at a spatial frequency of 10 to 100 $\mu m^{-1}$ is not more than 17 $nm^4$.

According to Configuration 5 of the present disclosure, a reflective mask capable of obtaining high contrast at the edges of a phase shift film pattern can be obtained by having a phase shift film that has high absolute reflectance within a prescribed range for which there is a small difference (shift) from the design value in the case of having designed such that the absolute reflectance of the phase shift film with respect to UV light is within a high prescribed range.

(Configuration 6)

Configuration 6 of the present disclosure is the reflective mask described in Configuration 5, wherein a protective film is formed on the multilayer reflective film.

According to Configuration 6, damage to the surface of the multilayer reflective film when fabricating a reflective mask (EUV mask) can be inhibited as a result of a reflective mask blank having a protective film on the multilayer reflective film. Consequently, the reflective mask may be fabricated using a reflective mask blank having a protective film on the multilayer reflective film.

(Configuration 7)

Configuration 7 of the present disclosure is the reflective mask described in Configuration 5 or 6, wherein root mean square roughness (Rms), obtained by measuring a 1 μm×1 μm region on the surface of the multilayer reflective film or the protective film with an atomic force microscope, is not more than 0.15 nm, and power spectrum density at a spatial frequency of 10 to 100 $\mu m^{-1}$ is not more than 7 $nm^4$.

According to Configuration 7 of the present disclosure, by making prescribed root mean square roughness (Rms) and power spectrum density at a prescribed spatial frequency to be within prescribed ranges in a prescribed region on the surface of a multilayer reflective film or protective film, a phase shift film can be obtained in which absolute reflectance with respect to UV light has a higher value. Consequently, the use of such a reflective mask makes it possible to increase the intensity of exposure light during exposure for manufacturing a semiconductor device. Consequently, throughput during manufacturing of a semiconductor device can be improved.

(Configuration 8)

Configuration 8 of the present disclosure is the reflective mask described in Configurations 5 to 7, wherein the difference between the power spectrum density on the surface of the phase shift film pattern and power spectrum density on the surface of the multilayer reflective film or protective film is not more than 10 nm$^4$.

According to Configuration 8 of the present disclosure, as a result of the difference between prescribed power spectrum densities being within a prescribed range, a reflective mask can be more reliably obtained that is capable of obtaining high contrast at the edges of a phase shift film pattern.

(Configuration 9)

Configuration 9 of the present disclosure is a method of manufacturing a semiconductor device comprising carrying out a lithography process using an exposure device using the reflective mask described in any of Configurations 5 to 8 to form a transfer pattern on a transferred substrate.

According to the method of manufacturing a semiconductor device of Configuration 9 of the present disclosure, since a reflective mask can be used that is capable of obtaining high contrast at the edges of a phase shift film pattern, a semiconductor device can be manufactured that has a fine and highly precise transfer pattern and in which the dimensions of a circuit pattern or other transfer pattern transferred to a resist film formed on a semiconductor substrate or other transferred substrate are accurate.

According to the present disclosure, since a phase shift film can be obtained that has high absolute reflectance within a prescribed range for which there is a small difference (shift) from the design value in the case of having designed such that the absolute reflectance of the phase shift film with respect to UV light is within a high prescribed range, a reflective mask can be obtained that is capable of obtaining high contrast at the edges of a phase shift film pattern. In addition, according to the present disclosure, a reflective mask blank can be obtained that is capable of obtaining high contrast at the edges of a phase shift film pattern.

In addition, according to the present disclosure, a method can be obtained for manufacturing a semiconductor device that has a fine and highly precise transfer pattern and in which the dimensions of a circuit pattern or other transfer pattern transferred to a resist film formed on a semiconductor substrate or other transferred substrate are accurate.

DETAILED DESCRIPTION

The present disclosure is a reflective mask blank having a multilayer reflective film, obtained by alternately laminating a high refractive index layer and a low refractive index layer, and a phase shift film on a main surface of a mask blank substrate.

Figure 5:
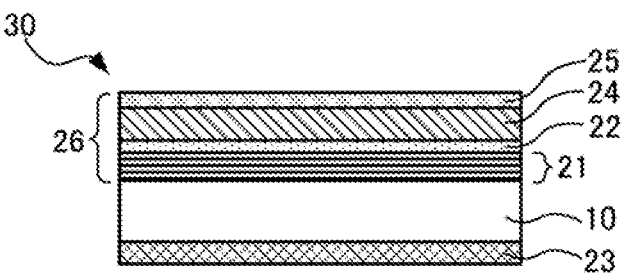
FIG. 5 is a cross-sectional schematic diagram showing another example of the configuration of a reflective mask blank of one embodiment of the present disclosure.

FIG. 5 is a schematic diagram showing one example of a reflective mask blank 30 of the present disclosure. The reflective mask blank 30 of the present disclosure has a mask blank multilayer film 26 comprising a multilayer reflective film 21 and a phase shift film 24 on a main surface of a mask blank substrate 10. In the present description, the mask blank multilayer film 26 refers to a plurality of films, comprising the multilayer reflective film 21 and the phase shift film 24, formed by laminating on a main surface of the mask blank substrate 10 in the reflective mask blank 30. The mask blank multilayer film 26 can further comprise a protective film 22 formed between the multilayer reflective film 21 and the phase shift film 24, and/or an etching mask film 25 formed on the surface of the phase shift film 24. In the case of the reflective mask blank 30 shown in FIG. 5, the mask blank multilayer film 26 on a main surface of the mask blank substrate 10 has the multilayer reflective film 21, the protective film 22, the phase shift film 24 and the etching mask film 25.

In the present description, "having a mask blank multilayer film 26 on a main surface of the mask blank substrate 10" includes the case in which the mask blank multilayer film 26 is arranged in contact with the surface of the mask blank substrate 10, as well as the case in which another film is present between the mask blank substrate 10 and the mask blank multilayer film 26. Namely, in this case, "on a main surface" refers to "on and/or above", having both the meanings of "on" and "above". In addition, in the present description, "a film A arranged in contact with the surface of a film B" refers to film A and film B being arranged so as to make direct contact without having another film interposed there between.

Figure 3:
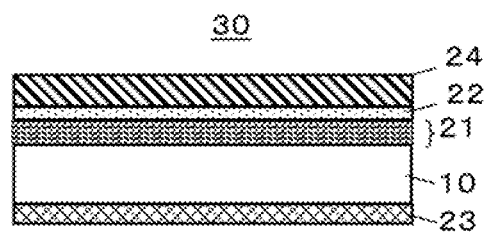
FIG. 3 is a cross-sectional schematic diagram showing one example of a reflective mask blank of one embodiment of the present disclosure.

FIG. 3 is a schematic diagram showing another example of the reflective mask blank 30 of the present disclosure. In the case of the reflective mask blank 30 of FIG. 3, although the mask blank multilayer film 26 has the multilayer reflective film 21, the protective film 22 and the phase shift film 24, it does not have the etching mask film 25.

The reflective mask blank 30 of the present disclosure is a reflective mask blank in which a multilayer reflective film and a phase shift film, which shifts the phase of EUV light, are formed on a substrate in that order. The reflective mask blank 30 of the present disclosure has a root mean square roughness (Rms), obtained by measuring a 1 μm×1 μm region on the surface of the phase shift film 24 with an atomic force microscope, of not more than 0.50 nm and a power spectrum density at a spatial frequency of 10 μm$^{-1}$ to 100 μm$^{-1}$ of not more than 17 nm$^4$.

According to the reflective mask blank 30 of the present disclosure, since the phase shift film 24 can be obtained that has high absolute reflectance within a prescribed range for which there is a small difference (shift) from the design value in the case of having designed such that the absolute reflectance of the phase shift film 24 with respect to UV light is within a high prescribed range, a reflective mask 40 can be fabricated that is capable of obtaining high contrast at the edges of a phase shift film pattern 27.

Next, the following provides an explanation of the parameters of surface roughness (Rmax, Rms) and power spectrum density (PSD), which indicate the surface morphology of the phase shift film 24.

Rms (root mean square), which is a typical indicator of surface roughness, refers to root mean square roughness and is the square root of the value obtained by averaging the squares of the deviation from an average line to a measurement curve. Rms is represented by the following formula (1):

[Equation 1]

$$\text{Rms} = \sqrt{\frac{1}{l}\int_0^l Z^2(x)\,dx} \quad (1)$$

wherein, l represents a reference length and Z represents the height from the average line to the measurement curve.

Similarly, Rmax, which is also a typical indicator of surface roughness, is the maximum height of surface roughness, and is the difference between the absolute values of maximum peak height and maximum trough depth on a roughness curve (difference between the highest peak and the deepest trough).

Rms and Rmax have conventionally been used to manage the surface roughness of the mask blank substrate 10, and are superior with respect to enabling surface roughness to be ascertained in terms of numerical values. However, since Rms and Rmax both only consist of information relating to height, they do not contain information relating to subtle changes in surface morphology.

In contrast, power spectrum analysis, which represents surface roughness using amplitude intensity at a spatial frequency by converting surface irregularities of the resulting surface to spatial frequency regions, enables quantification of subtle changes in surface morphology. When Z(x,y) is taken to represent height data at an x coordinate and y coordinate, then the Fourier transformation thereof is given by the following equation (2).

[Equation 2]

$$F(u,v) = \frac{1}{N_x N_y}\sum_{u=0}^{N_x-1}\sum_{v=0}^{N_y-1} Z(x,y)\exp\left[-i2\pi\left(\frac{ux}{N_x}+\frac{vy}{N_y}\right)\right] \quad (2)$$

Here, $N_x$ and $N_y$ represent the number of data sets in the x direction and y direction. u represents 0, 1, 2, . . . Nx−1, v represents 0, 1, 2 . . . Ny−1, and spatial frequency f at this time is given by the following equation (3).

[Equation 3]

$$f = \left\{\left[\frac{u}{(N_x-1)d_x}\right]^2 + \left[\frac{v}{(N_y-1)d_y}\right]^2\right\}^{1/2} \quad (3)$$

Here, in equation (3), $d_x$ represents the minimum resolution in the x direction while $d_y$ represents the minimum resolution in the y direction.

Power spectrum density PSD at this time is given by the following equation (4).

$$P(u,v) = |F(u,v)|^2 \quad \text{[Equation 4]}$$

This power spectrum analysis is superior in that it not only makes it possible to ascertain changes in the surface morphology of the phase shift film 24 of the reflective mask blank 30 as simple changes in height, but also as changes at that spatial frequency. Power spectrum analysis is a technique for analyzing the effects of microscopic reactions at the atomic level on the surface.

The integrated value of power spectrum density (PSD) can be used in the case of evaluating surface morphology of a phase shift film of the reflective mask blank 30 by power spectrum analysis. Integrated value I refers to the area of a prescribed range of spatial frequency depicted by values of power spectrum density (PSD) versus spatial frequency as exemplified in FIG. 6, and is defined in the manner of equation (5).

[Equation 5]

$$I = \sum_i (f_{i+1} - f_i)P(f_i) \quad (5)$$

[Equation 6]

$$f_i = \frac{i}{X'},\ i = 1, 2, \ldots \frac{N'}{2} \quad (6)$$

Spatial frequency f is defined in the manner of equation (3), and power spectrum density is uniquely calculated as a function of spatial frequency determined by the values of u and v. Here, in order to calculate power spectrum density for a discrete spatial frequency, spatial frequency $f_i$ is defined in the manner of equation (6) when the measured region and number of data points are equal in the x direction and y direction. Here, X' and N' represent the measured region and number of data points. $P(f_i)$ represents power spectrum density at spatial frequency $f_i$.

In the reflective mask blank 30 of the present disclosure, in order to achieve the aforementioned object using the aforementioned surface roughness (Rms) and power spectrum density, root mean square roughness (Rms), obtained by measuring a 1 μm×1 μm region of the surface of the phase shift film 24 with an atomic force microscope, is not more than 0.50 nm, and power spectrum density at a spatial frequency of 10 to 100 μm$^{-1}$ is not more than 17 nm$^4$.

In the present disclosure, the aforementioned 1 μm×1 μm region of the surface of the phase shift film 24 may be any arbitrary location of a region where a transfer pattern is formed. In the case the mask blank substrate 10 is a 6025 size (152 mm×152 mm×6.35 mm), then the transfer pattern formation region can be, for example, a 142 mm×142 mm region, a 132 mm×132 mm region or a 132 mm×104 mm region obtained by excluding the peripheral region of the surface of the reflective mask blank substrate 30. In addition, the aforementioned arbitrary location can be a region located in the center of the surface of the reflective mask blank 30, for example.

In addition, in the present disclosure, the aforementioned 1 μm×1 μm region can be a region located in the center of the film surface of the phase shift film 24. For example, in the case the film surface of the phase shift film 24 of the reflective mask blank 30 has a rectangular shape, the aforementioned center is located at the intersection of the diagonal lines of the aforementioned rectangle. Namely, the aforementioned intersection and the center of the aforementioned region (the center of the region is the same as the center of the film surface) coincide.

In addition, the previously explained 1 μm×1 μm region, the transfer pattern formation region and the arbitrary location can also be applied to the mask blank substrate 10 and a substrate with a multilayer reflective film 20 depending on the case.

In addition, the power spectrum density at a spatial frequency of 10 μm$^{-1}$ to 100 μm obtained by measuring a 1 μm×1 μm region on the surface of the phase shift film 24 of the reflective mask blank 30, can be made to be not more than 17 nm$^4$. The power spectrum density at a spatial frequency of 10 μm$^{-1}$ to 100 μm$^{-1}$ may be not more than 14 nm$^4$, and the power spectrum density at a spatial frequency of 10 μm$^{-1}$ to 100 μm$^{-1}$ may be not more than 10 nm$^4$.

In addition, the aforementioned root mean square roughness (Rms) may be not more than 0.50 nm, may be not more than 0.45 nm, even may be not more than 0.40 nm, and still may be not more than 0.36 nm. In addition, maximum height (Rmax) may be not more than 5 nm, may be not more than 4.5 nm, even may be not more than 4 nm, and still may be not more than 3.5 nm.

In addition, in the reflective mask blank 30 of the present disclosure, in order to achieve the aforementioned object, an integrated value I of the power spectrum density at a spatial frequency of 10 μm$^{-1}$ to 100 μm$^{-1}$ obtained by measuring a 1 μm×1 μm region of the surface of the mask blank multilayer film 26 with an atomic force microscope may be not more than 360 nm$^3$. The aforementioned integrated value I is even may be not more than 300 nm$^3$. The aforementioned integrated value I is may be not more than 250 nm$^3$.

The use of the reflective mask blank 30 of the present disclosure allows the obtaining of the phase shift film 24 having high absolute reflectance within a prescribed range for which there is a small difference (shift) from the design value in the case of having designed such that the absolute reflectance of the phase shift film 24 with respect to UV light is within a high prescribed range. Consequently, the reflective mask 40 can be fabricated that is capable of obtaining high contrast at the edges of a phase shift film pattern.

Next, a detailed explanation is provided of the reflective mask blank 30 of the present disclosure.

[Mask Blank Substrate 10]

First, an explanation is provided of the mask blank substrate 10 that can be used to fabricate the reflective mask blank 30 of the present disclosure.

Figure 1A:
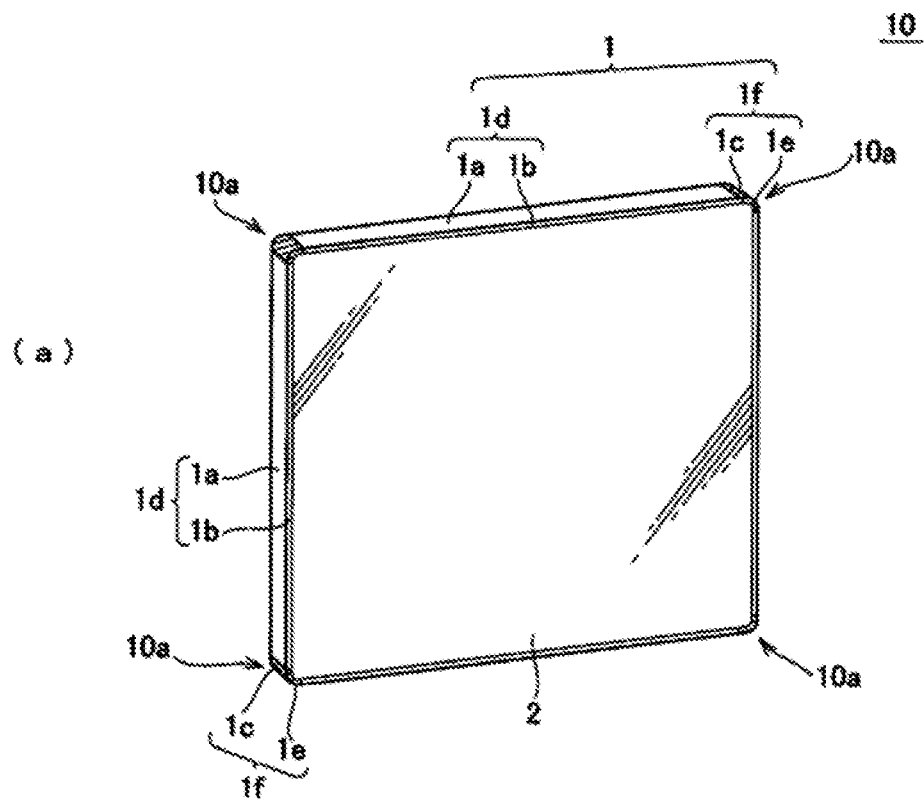
FIG. 1(a) is a perspective view showing a mask blank substrate according to one embodiment of the present disclosure.
Figure 1B:
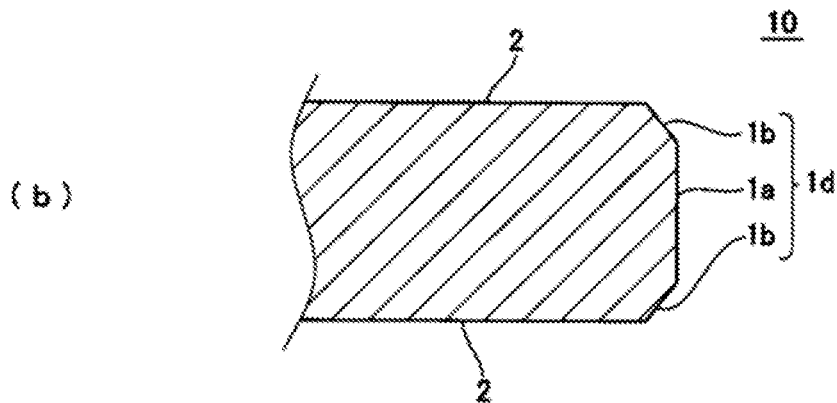
FIG. 1(b) is a cross-sectional schematic diagram showing a mask blank substrate of the present embodiment.

FIG. 1(a) is a perspective view showing one example of the mask blank substrate 10 that can be used to fabricate the reflective mask blank 30 of the present disclosure. FIG. 1(b) is a cross-sectional schematic diagram of the mask blank substrate 10 shown in FIG. 1(a).

The mask blank substrate 10 (which may be simply referred to as the "substrate 10" or "glass substrate 10") is a rectangular plate-like body, and has two opposing main surfaces 2 and an edge face 1. The two opposing main surfaces 2 constitute an upper surface and a lower surface of this plate-like body, and are formed so as to be mutually opposing. In addition, at least one of the two opposing main surfaces 2 is a main surface on which a transfer pattern is to be formed.

The edge face 1 constitutes the lateral surface of this plate-like body, and is adjacent to the outer edges of the opposing main surfaces 2. The edge face 1 has a flat edge face portion 1d and a curved edge face portion 1f. The flat edge face portion 1d is a surface that connects a side of one of the opposing main surfaces 2 and a side of the other opposing main surface 2, and comprises a lateral surface portion 1a and a chamfered surface portion 1b. The lateral surface portion 1a is a portion (T surface) that is nearly perpendicular to the opposing main surfaces 2 in the flat edge face portion 1d. The chamfered surface portion 1b is a portion (C surface) that is chamfered between the lateral surface portion 1a and the opposing main surfaces 2, and is formed between the lateral surface portion 1a and the opposing main surfaces 2.

The curved edge face portion if is a portion (R portion) that is adjacent to the vicinity of a corner portion 10a of the substrate 10 when the substrate 10 is viewed from overhead, and comprises a lateral surface portion 1c and a chamfered surface portion 1e. Here, when the substrate 10 is viewed from overhead, the substrate 10 appears in, for example, a direction perpendicular to the opposing main surfaces 2. In addition, the corner portion 10a of the substrate 10 refers to, for example, the vicinity of the intersection of two sides along the outer edge of the opposing main surfaces 2. An intersection of two sides is the intersection of lines respectively extending from two sides. In the present example, the curved end face portion if is formed into a curved shape by rounding the corner portion 10a of the substrate 10.

In order to more reliably achieve the object of the present disclosure, the main surfaces of the mask blank substrate 10 used in the reflective mask blank 30 of the present disclosure and the surface of the multilayer reflective film 21 of the substrate with a multilayer reflective film 20 may have a prescribed surface roughness.

In addition, the main surfaces of the mask blank substrate 10 may be processed by catalyst referred etching (CARE). CARE refers to a surface processing method involving arranging a processing target (mask blank substrate) and catalyst in a treatment liquid or supplying a treatment liquid between the processing target and the catalyst, allowing the processing target and catalyst to make contact, and processing the processing target with an active species generated from molecules in the treatment liquid that have been adsorbed on the catalyst at that time. Furthermore, in the case the processing target is composed of a solid oxide such as glass, water is used for the treatment liquid, the processing target and the catalyst are allowed to make contact in the presence of the water, and the catalyst and surface of the processing target are allowed to undergo relative motion and the like to remove decomposition products of hydrolysis from the surface of the processing target.

The main surfaces of the mask blank substrate 10 are selectively processed by catalyst referred etching starting from convex portions that contact a reference surface in the form of a catalyst surface. Consequently, surface irregularities (surface roughness) that compose the main surfaces maintain an extremely high level of smoothness resulting in an extremely uniform surface morphology, while also resulting in a surface morphology in which the proportion of concave portions that compose the reference surface is greater than the proportion of convex portions. Thus, in the case of laminating a plurality of thin films on the aforementioned main surfaces, since the size of defects on the main surfaces tends to become small, surface processing by catalyst referred etching results in better defect quality. This effect is especially demonstrated in the case of forming the multilayer reflective film 21 to be subsequently described on the aforementioned main surfaces. In addition, as a result of processing the main surfaces by catalyst referred etching as previously described, a surface having a prescribed range of surface roughness and a prescribed power spectrum density as previously described can be formed comparatively easily.

Furthermore, in the case the material of the substrate 10 is a glass material, at least one type of material selected from the group consisting of platinum, gold, transition metals and alloys comprising at least one of these materials can be used for the catalyst. In addition, at least one type of liquid selected from the group consisting of pure water, functional water such as ozonated water or hydrogen water, low-concentration aqueous alkaline solutions and low-concentration aqueous acidic solutions can be used for the treatment liquid.

A main surface on the side of the mask blank substrate 10 used in the reflective mask blank 30 of the present disclosure on which a transfer pattern is formed may be processed so as to have high flatness at least from the viewpoints of obtaining pattern transfer accuracy and positional accuracy. In the case of an EUV reflective mask blank substrate, flatness in a 132 mm×132 mm region or a 142 mm×142 mm region on a main surface of the substrate 10 on the side on which a transfer pattern is formed may be not more than 0.1 µm and particularly preferably not more than 0.05 µm. In addition, flatness in a 132 mm×132 mm region on a main surface of the substrate 10 on the side on which a transfer pattern is formed may be not more than 0.03 µm. In addition, the main surface on the opposite side from the side on which a transfer pattern is formed is the side that is clamped with an electrostatic chuck when the substrate is placed in an exposure apparatus. The flatness of this main surface in a 142 mm×142 mm region may be not more than 1 µm and may be not more than 0.5 µm.

Any material may be used for the material of the reflective mask blank substrate 10 for EUV exposure provided it has low thermal expansion properties. For example, a $SiO_2$—$TiO_2$-based glass having low thermal expansion properties (such as a two-element system ($SiO_2$—$TiO_2$) or three-element system (such as $SiO_2$—$TiO_2$—$SnO_2$)), or a so-called multicomponent glass such as $SiO_2$—$Al_2O_3$—$Li_2O$-based crystallized glass, can be used. In addition, a substrate other than the aforementioned glass made of silicon or metal and the like can also be used. An example of the aforementioned metal substrate is an invar alloy (Fe—Ni-based alloy).

As was previously described, in the case of the mask blank substrate 10 for EUV exposure, a multicomponent glass material is used since the substrate is required to have low thermal expansion properties. However, there is the problem of it being difficult to obtain high smoothness with a multicomponent glass material in comparison with synthetic quartz glass. In order to solve this problem, a thin film composed of a material composed of a metal or an alloy, or a thin film composed of a material containing at least one of oxygen, nitrogen and carbon in a metal or alloy, is formed on a substrate composed of a multicomponent glass material. A surface having a surface roughness within the aforementioned ranges can then be formed comparatively easily by subjecting the surface of the thin film to mirror polishing and surface treatment.

Examples of the material of the aforementioned thin film include Ta (tantalum), alloys containing Ta, and Ta compounds containing at least one of oxygen, nitrogen and carbon in Ta or an alloy containing Ta. Examples of Ta compounds that can be applied include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON. Among these Ta compounds, TaN, TaON, TaCON, TaBN, TaBON, TaBCON, TaHfN, TaHfON, TaHfCON, TaSiN, TaSiON and TaSiCON that contain nitrogen (N) may be used. Furthermore, from the viewpoint of high smoothness of the thin film surface, the aforementioned thin film may have an amorphous structure. The crystal structure of the thin film can be measured with an X-ray diffraction (XRD) analyzer.

Furthermore, in the present disclosure, there are no particular limitations on the processing method used to obtain surface roughness defined as previously described.

[Substrate with Multilayer Reflective Film 20]

The following provides an explanation of the substrate with a multilayer reflective film 20 that can be used in the reflective mask blank 30 of the present disclosure.

Figure 2:
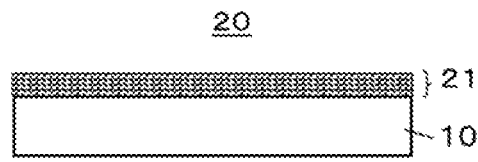
FIG. 2 is a cross-sectional schematic diagram showing one example of the configuration of a substrate with a multilayer reflective film according to one embodiment of the present disclosure.

FIG. 2 is a schematic diagram of one example of the substrate with a multilayer reflective film 20 able to be used in the reflective mask blank 30.

The substrate with a multilayer reflective film 20 of the present embodiment has a structure having the multilayer reflective film 21 on a main surface of the previously explained mask blank substrate 10 on the side on which a transfer pattern is formed. This multilayer reflective film 21 imparts a function of reflecting EUV light in a reflective mask 40 for EUV lithography, and adopts a configuration in which elements having different refractive indices are cyclically laminated.

There are no particular limitations on the material of the multilayer reflective film 21 provided it reflects EUV light. The reflectance of the multilayer reflective film 21 alone (absolute reflectance) is normally not less than 65% and the upper limit thereof is normally 73%. This type of multilayer reflective film 21 can be that of a multilayer reflective film 21 in which a thin film composed of a high refractive index material (high refractive index layer) and a thin film composed of a low refractive index material (low refractive index layer) are alternately laminated for about 40 to 60 cycles.

For example, the multilayer reflective film 21 for EUV light of a wavelength of 13 nm to 14 nm may consist of an Mo/Si cyclically laminated film obtained by alternately laminating about 40 cycles of an Mo film and Si film. In addition, a multilayer reflective film used in the region of EUV light may consist of, for example, an Ru/Si cyclically laminated film, Mo/Be cyclically laminated film, Mo compound/Si compound cyclically laminated film, Si/Nb cyclically laminated film, Si/Mo/Ru cyclically laminated film, Si/Mo/Ru/Mo cyclically laminated film or Si/Ru/Mo/Ru cyclically laminated film.

The method used to form the multilayer reflective film 21 is known in the art, and can be formed by depositing each layer by, for example, magnetron sputtering or ion beam sputtering. In the case of the aforementioned Mo/Si cyclically laminated film, an Si film having a thickness of about several nanometers is first deposited on the substrate 10 using a Si target by, for example, ion beam sputtering. Subsequently, an Mo film having a thickness of about several nanometers is deposited using an Mo target. With the Si film and the Mo film as one cycle, the multilayer reflective film 21 is then formed by laminating for 40 to 60 cycles with the alternate deposition thereof.

When fabricating the reflective mask blank 30 of the present disclosure, the multilayer reflective film 21 may be formed by ion beam sputtering by alternately irradiating a sputtering target of a high refractive index material and a sputtering target of a low refractive index material with an ion beam. As a result of forming the multilayer reflective film 21 by a prescribed ion beam sputtering method, the multilayer reflective film 21 can be obtained having favorable reflectance properties with respect to EUV light.

In the reflective mask blank 30 of the present disclosure, the mask blank multilayer film 26 may comprises the protective film 22 arranged in contact with the surface of the multilayer reflective film 21 on the opposite side from the mask blank substrate 10. Namely, the reflective mask blank 30 of the present disclosure may have the protective layer 22 formed on the multilayer reflective film 21.

The protective film 22 (see FIG. 3) can be formed on the multilayer reflective film 21 to protect the multilayer reflective film 21 from dry etching or wet cleaning in the fabrication process of the reflective mask 40 for EUV lithography. In this manner, an aspect having the multilayer reflective film 21 and the protective film 22 on the mask blank substrate 10 can also constitute the substrate with a multilayer reflective film 20 in the present disclosure.

Furthermore, although materials selected from, for example, Ru, Ru—(Nb, Zr, Y, B, Ti, La, Mo), Si—(Ru, Rh, Cr, B), Si, Zr, Nb, La and B can be used for the material of the aforementioned protective film 22, among these materials, reflectance properties of the multilayer reflective film 21 can be made more favorable if a material comprising ruthenium (Ru) is applied. More specifically, the material of the protective film 22 may be Ru or Ru—(Nb, Zr, Y, B, Ti, La, Mo). This type of protective film 22 is particularly effective in the case of using a Ta-based material for the phase shift film 24 and patterning the phase shift film 24 by dry etching using a Cl-based gas.

Furthermore, in the aforementioned substrate with a multilayer reflective film 20, the surface of the multilayer reflective film 21 or the protective film 22 is such that the power spectrum density at a spatial frequency of 10 $\mu m^{-1}$ to 100 $\mu m^{-1}$, obtained by measuring a 1 $\mu m \times 1$ $\mu m$ region thereof with an atomic force microscope, can be made to be not more than 7 $nm^4$ and may be not more than 6.5 $nm^4$. As a result of configuring in this manner, the surface of the subsequently formed phase shift film 24 can be made to have a prescribed power spectrum density at a prescribed spatial frequency.

In addition, in order to improve reflection properties required for use as the substrate with a multilayer reflective film 20, the root mean square roughness (Rms) of the aforementioned substrate with a multilayer reflective film 20 on the surface of the multilayer reflective film 21 or the protective film 22, obtained by measuring a 1 $\mu m \times 1$ $\mu m$ region with an atomic force microscope, is not more than 0.15 nm, may not be more than 0.12 nm and may be not more than 0.10 nm.

In order to maintain the surface morphology of the aforementioned substrate 10 within the aforementioned ranges and allow the surface of the multilayer reflective film 21 or the protective film 22 to have a power spectrum density within the aforementioned ranges, a high refractive index layer and a low refractive index layer can be allowed to accumulate so that sputtered particles enter at an angle to the normal of a main surface of the substrate 10 when depositing the multilayer reflective film 21 by sputtering. More specifically, the incident angle of sputtered particles for depositing a low refractive index layer comprising of Mo and the like and the incident angle of sputtered particles for depositing a high refractive index layer comprising Si and the like are greater than 0 degrees to not more than 45 degrees. The incident angle of sputtered particles may be greater than 0 degrees to not more than 40 degrees, and even may be greater than 0 degrees to not more than 30 degrees. Moreover, the protective film 22 formed on the multilayer reflective film 21 may also be formed by ion beam sputtering in continuation therefrom so that the protective film 22 accumulates as a result of sputtered particles entering on an angle to the normal of a main surface of the substrate 10.

In addition, in the substrate with a multilayer reflective film 20, a back side electrically conductive film 23 (see FIG. 3), provided for the purpose of electrostatic clamping, can be formed on the surface of the mask blank substrate 10 on the opposite side from the surface contacting the multilayer reflective film 21 of the substrate 10. In this manner, an aspect having the multilayer reflective film 21 and the protective film 22 on the side of the mask blank substrate 10 on which a transfer pattern is formed, and having the back side electrically conductive film 23 on the surface on the opposite side from the surface contacting the multilayer reflective film 21, can also constitute the substrate with a multilayer reflective film 20 in the present disclosure. Furthermore, the electrical property (sheet resistance) required by the back side electrically conductive film 23 is normally not more than 100 $\Omega$/square. The method used to form the back side electrically conductive film 23 is a known method. The back side electrically conductive film 23 can be formed by, for example, using a metal or alloy target of Cr or Ta and the like by magnetron sputtering or ion beam sputtering.

In addition, the substrate with a multilayer reflective film 20 of the present embodiment may also have a base layer 20 formed between the substrate 10 and the multilayer reflective film 21. The base layer can be formed for the purpose of improving smoothness of a main surface of the substrate 10, reducing defects, demonstrating the effect of enhancing reflectance of the multilayer reflective film 21, and compensating for stress in the multilayer reflective film 21.

[Reflective Mask Blank 30]

The following provides an explanation of the reflective mask blank 30 of the present disclosure.

FIG. 3 is a schematic diagram showing one example of the reflective mask blank 30 of the present disclosure. The reflective mask blank 30 employs a configuration in which a phase shift film 24 serving as a transfer pattern is formed on the protective film 22 of the substrate with a multilayer reflective film 20 that was previously explained.

[Phase Shift Film]

The phase shift film 24 is formed on the multilayer reflective film 21 or the protective film 22 formed on the multilayer reflective film 21. The phase shift film 24 shifts the phase of EUV light by absorbing EUV light and reflecting a portion thereof. Namely, the phase shift film 24 absorbs EUV light while reflecting a portion thereof so as not to affect pattern transfer at those portions where the phase shift film 24 remains on the reflective mask 40 patterned with the phase shift film 24. EUV light reflected by the phase shift film 24 forms a phase difference with reflected light from the multilayer reflective film 21. The phase shift film 24 is formed so that absolute reflectance with respect to EUV light is 1% to 6% and the phase difference between light reflected from the phase shift film 24 and light reflected from the multilayer reflective film 21 is 170 degrees to 190 degrees. The film thickness of the phase shift film 24 is suitably determined corresponding to the materials used and the design value of absolute reflectance, and is conditioned on the phase difference falling within the aforementioned range.

There are no particular limitations on the material of the phase shift film 24 provided it has a function of absorbing EUV light and can be removed by etching and the like. In the present embodiment, tantalum alone or a tantalum-based material containing tantalum is used for the material of the phase shift film 24 from the viewpoint of etching selectivity and the like. Specific examples of tantalum-based materials include TaB alloys containing Ta and B, TaSi alloys containing Ta and Si, Ta alloys containing Ta and other transition metals (such as Pt, Pd or Ag), and tantalum-based compounds obtained by adding N, O, H and/or C to Ta metal or alloys thereof.

The phase shift film 24 composed of tantalum or a tantalum compound can be formed by a known method in the manner of a sputtering method such as DC sputtering or RF sputtering.

In addition, the crystalline state of the phase shift film 24 is such that it may have an amorphous or microcrystalline structure from the viewpoint of smoothness. If the phase shift film 24 is not smooth, edge roughness of a phase shift film pattern increases and dimensional accuracy of the pattern becomes poor. Surface roughness of the phase shift film 24 is such that the root mean square roughness (Rms) is not more than 0.50 nm, may be not more than 0.45 nm, even may be not more than 0.40 nm and still may be 0.36 nm.

Ta has a large absorption coefficient with respect to EUV light, and since it can also be easily dry etched with chlorine-based gas and fluorine-based gas, it demonstrates superior processability as a phase shift film material. Moreover, an amorphous structure is easily obtained by adding, for example, B and/or Si or Ge and the like to Ta, thereby making it possible to improve smoothness of the phase shift film 24. In addition, if N and/or 0 are added to Ta, resistance to oxidation of the phase shift film 24 improves, thereby obtaining the effect of making it possible to improve stability over time.

The phase shift film 24 may not only be formed by a single layer of a tantalum-based material, but may also be formed by laminating a plurality of layers of a tantalum-based material. In addition, the phase shift film 24 includes that formed by laminating a layer of tantalum-based material and a layer of another material. More specifically, a chromium-based material layer and ruthenium-based material layer can be used for the layer of another material. In this case, Cr alone, Cr alloys containing Cr and other transition metals (such as Pt, Pd and Ag), and chromium-based compounds obtained by adding N, O, H and C, for example, to Cr metal and/or Cr alloys can be used for the chromium-based material. The ruthenium-based material may be Ru metal alone or an Ru alloy containing Ru and a metal such as Nb, Zr, Y, B, Ti, La, Mo, Co and/or Re. In addition, the ruthenium-based material may also be a ruthenium-based compound obtained by adding N, O, H and/or C, for example, to Ru metal or an alloy thereof. In the case of forming the phase shift film 24 according to a laminated structure consisting of a tantalum-based material layer and a layer of another material (case of laminating a layer of another material onto a tantalum-based material layer), deposition may be carried out continuously from the start of deposition to completion of deposition without exposing to air. As a result, the formation of an oxide layer (tantalum oxide layer) on the surface of the tantalum-based material layer can be prevented. In this case removing the tantalum oxide layer is not required.

There are no particular limitations on the order in which the tantalum-based material layer and chromium-based material layer are laminated or on the number of layers laminated in the phase shift film 24. For example, the phase shift film 24 may have, for example, a Ta/Cr two-layer structure, Cr/Ta two-layer structure, Ta/Cr/Ta three-layer structure, Cr/Ta/Cr three-layer structure, Ta/Cr/Ta/Cr four-layer structure, Cr/Ta/Cr/Ta four-layer structure, Ta/Ta/Cr/Cr four-layer, Cr/Cr/Ta/Ta four-layer structure in that order starting from the substrate 10 side or other structure. However, the material adjacent to the multilayer reflective film 21 or protective film 22 formed on the multilayer reflective film 21 may be a tantalum-based material layer. In addition, the outermost layer of the phase shift film 24 can be a chromium-based material or tantalum-based material (such as a TaSi-based material layer). However, the outermost layer of the phase shift film 24 may be a chromium-based material layer. This is because a chromium-based material layer has the function of an anti-oxidation film that prevents oxidation of the tantalum-based material layer. Namely, a decrease in the etching rate caused by oxidation of the tantalum-based material layer is inhibited by using a chromium-based material layer for the uppermost layer. Moreover, in the case of using a chromium-based material layer for the outermost layer of the phase shift film 24, the material of the outermost layer may be a material that contains nitrogen from the viewpoint of controlling the power spectrum density on the surface of the phase shift film, and examples of such materials include CrN, CrON, CrCN, CrCON, CrHN, CrOHN, CrCHN or CrCONH. In addition, from the viewpoint of chemical resistance during mask cleaning, the material of the outermost layer may be a material containing carbon, specific examples of which include CrC, CrCO, CrCN, CrCON, CrCH, CrCOH, CrCHN and CrCONH. The chromium-based material and tantalum-based material may contain nitrides, oxides or alloys other than metal alone, and are not necessarily required to have the same materials or configuration.

There are no particular limitations on the order in which the tantalum-based material layer and ruthenium-based material layer are laminated or on the number of layers laminated in the phase shift film 24. For example, the phase shift film 24 may have, for example, a Ta/Ru two-layer structure, Ta/Ru/Ta three-layer structure, Ta/Ru/Ta/Ru four-layer structure, Ta/Ta/Ru/Ru structure in that order starting from the substrate 10 side or other structure. Thus, the outermost layer of the phase shift film 24 can be a ruthenium-based material layer or tantalum-based material layer (such as a TaSi-based material layer). However, the material adjacent to the multilayer reflective film 21 or protective film 22 formed on the multilayer reflective film 21 may be a tantalum-based material layer, and the outermost layer of the phase shift film 24 may be a ruthenium-based material layer. As a result, a ruthenium-based material layer can have the function of an anti-oxidation film that prevents oxidation of the tantalum-based material layer. The tantalum-based material and ruthenium-based material may contain nitrides, oxides or alloys other than metal alone, and are not necessarily required to have the same materials or configuration.

Moreover, the tantalum-based material layer, ruthenium-based material layer and chromium-based material layer may be laminated in the phase shift film 24, and there are no particular limitations on the order in which they are laminated or on the number of layers. For example, the phase shift film 24 may have a Ta/Ru/Cr three-layer structure, Ta/Cr/Ru three-layer structure in that order starting from the substrate 10 side or other structure.

The phase shift film 24 of the reflective mask blank 30 of the present disclosure may have a tantalum-based material layer containing tantalum and nitrogen, and a chromium-based material layer containing chromium and nitrogen on the tantalum-based material layer. As a result of the phase shift film 24 having a tantalum-based material layer and chromium-based material layer, a phase shift film can be obtained that has high absolute reflectance with respect to EUV light while having a prescribed phase shift effect.

Furthermore, the film thickness of the chromium-based material layer may be 5 nm to 30 nm. The formation of an oxide layer (tantalum oxide layer) on the surface of the tantalum-based material layer can be prevented by making the film thickness of the chromium-based material layer covering the tantalum-based material layer to be within a prescribed range.

In the reflective mask blank 30 of the present disclosure, in the case the phase shift film 24 contains a tantalum-based material layer containing tantalum and nitrogen, the nitrogen content thereof may be 5 at % to 50 at %, may be 5 at % to 30 at % and even may be 5 at % to 20 at %. In addition, in the case the phase shift film 24 contains a chromium-based material layer containing chromium and nitrogen, the nitrogen content thereof may be 5 at % to 50 at %, may be 5 at % to 30 at % and even may be 5 at % to 20 at %.

In the case the phase shift film 24 contains a tantalum-based material layer containing tantalum and nitrogen, by making the nitrogen content thereof to be 5 at % to 50 at %, the root mean square roughness (Rms) and the amplitude intensity of all roughness components detectable in a 1 µm×1 µm region at a spatial frequency of 10 µm$^{-1}$ to 100 µm$^{-1}$ in the form of power spectrum density of the surface of the phase shift film 24 are within the prescribed range of values. In addition, in the case the phase shift film 24 contains a chromium-based material layer containing chromium and nitrogen, the aforementioned power spectrum density is within the prescribed range of values similar to the case of the nitrogen content being 5 at % to 50 at %. In the case of these phase shift films 24, pattern edge roughness can be reduced when patterning the phase shift film 24 since enlargement of crystal grains composing the phase shift film can be inhibited.

In the case of the reflective mask blank 30 of the present disclosure, the root mean square roughness (Rms), obtained by measuring a 1 µm×1 µm region on the surface of the phase shift film 24 with an atomic force microscope, and power spectrum density at a spatial frequency of 10 µm$^{-1}$ to 100 µm$^{-1}$ are made to be within the prescribed ranges of values. The use of the reflective mask blank 30 of the present disclosure having this structure allows the obtaining of the phase shift film 24 having high absolute reflectance within a prescribed range for which there is a small difference (shift) from the design value in the case of having designed such that the absolute reflectance of the phase shift film 24 with respect to UV light is within a high prescribed range. Consequently, use of the reflective mask blank 30 of the present disclosure allows the fabrication of a reflective mask 40 capable of obtaining high contrast at the edges of the phase shift film pattern 27.

Furthermore, the reflective mask blank 30 of the present disclosure is not limited to the configuration shown in FIG. 3. For example, a resist film serving as a mask for patterning the aforementioned phase shift film 24 can also be formed on the phase shift film 24. In this case, this reflective mask with a resist film 30 can also constitute the reflective mask blank 30 of the present disclosure. Furthermore, the resist film formed on the phase shift film 24 may be a positive resist or a negative resist. In addition, the resist film may also be for electron beam drawing or laser drawing. Moreover, a so-called hard mask film (etching mask film 25) can also be formed between the phase shift film 24 and the aforementioned resist film. This aspect comprising a hard mask film (etching mask film 25) can also constitute the reflective mask blank 30 of the present disclosure.

[Etching Mask Film 25]

In the reflective mask blank 30 of the present disclosure, the mask blank multilayer film 26 may comprise the etching mask film 25 arranged in contact with the surface of the phase shift film 24 on the opposite side from the mask blank substrate 10. In the case of the reflective mask blank 30 shown in FIG. 5, the mask blank multilayer film 26 on a main surface of the mask blank substrate 10 further has the etching mask film 25 in addition to the multilayer reflective film 21, the protective film 22 and the phase shift film 24. The reflective mask blank 30 of the present disclosure can further have a resist film on the outermost surface of the mask blank multilayer film 26 of the reflective mask blank 30 shown in FIG. 5.

More specifically, in the case the material of the uppermost layer of the phase shift film is composed of a chromium-based material layer, the reflective mask blank 30 of the present disclosure may employ a structure in which the etching mask blank 25 composed of a material containing tantalum is formed. In addition, in the case the material of the uppermost layer of the phase shift film 24 uses Ta alone or a material having Ta as the main component thereof, a structure may be employed in which the etching mask film 25 composed of a material containing chromium is formed on the phase shift film 24. As a result of using the reflective mask blank 30 having such a structure, favorable optical properties of the phase shift film 24 can be obtained even if the etching mask film 25 is removed by dry etching using a chlorine-based gas, fluorine-based gas or mixed gas of a chlorine-based gas and fluorine-based gas after forming a transfer pattern on the phase shift film 24 when fabricating the reflective mask 40. In addition, a reflective mask 40 can be fabricated having favorable line edge roughness of a transfer pattern formed on the phase shift film 24.

Examples of materials containing tantalum that form the etching mask film 25 include TaN, TaON, TaCON, TaBN, TaBON, TaBCON, TaHfN, TaHfON, TaHfCON, TaSiN, TaSiON and TaSiCON. Examples of materials containing chromium that form the etching mask film 25 include materials containing chromium and one or more elements selected from nitrogen, oxygen, carbon and boron. Examples thereof include CrN, CrON, CrCN, CrCON, CrBN, CrBON, CrBCN and CrBOCN. The aforementioned materials may also contain materials other than chromium within a range that allows the effects of the present disclosure to be obtained. The film thickness of the etching mask film 25 may be not less than 3 nm from the viewpoint of functioning as an etching mask with which a transfer pattern is accurately formed on the phase shift film 24. In addition, the film thickness of the etching mask film 25 may be not more than 15 nm from the viewpoint of reducing film thickness of the resist film.

In the case the outermost surface of the reflective mask blank 30 of the present disclosure is the etching mask film 25, similar to the case of the outermost surface of the reflective mask blank 30 being the phase shift film 24, the root mean square roughness (Rms), obtained by measuring a 1 µm×1 µm region on the surface of the etching mask film 25 with an atomic force microscope, and the power spectrum density at a spatial frequency of 10 µm$^{-1}$ to 100 µm$^{-1}$, can be made to be within the prescribed ranges of values, thereby enabling management of the power spectrum density of the phase shift film. In the reflective mask blank 30 of the present disclosure having such a structure, the phase shift film 24 can be obtained that has high absolute reflectance within a prescribed range for which there is a small difference (shift) from the design value in the case of having designed such that the absolute reflectance of the phase shift film with respect to UV light is within a high prescribed range. Consequently, as a result of using the reflective mask blank 30 of the present disclosure having such a structure, a reflective mask 40 can be fabricated that is capable of obtaining high contrast at the edges of the phase shift film pattern 27.

[Method of Manufacturing Reflective Mask Blank 30]

The following provides an explanation of a method of manufacturing the reflective mask blank 30 of the present disclosure.

The reflective mask blank 30 of the present disclosure comprises the multilayer reflective film 21, obtained by alternately laminating a high refractive index layer and a low refractive index layer, and the phase shift film 24 on a main surface of the mask blank substrate 10. The method of manufacturing the reflective mask blank 30 of the present disclosure comprises forming the multilayer reflective film 21 on a main surface of the mask blank substrate 10, and forming the phase shift film 24 on the multilayer reflective film 21. In the method of manufacturing the reflective mask blank 30 of the present disclosure, the phase shift film 24 is formed so that the surface of the reflective mask blank 30 has a root mean square roughness (Rms), obtained by measuring a 1 μm×1 nm region with an atomic force microscope, of not more than 0.50 nm, and has a power spectrum density at a spatial frequency of 10 $\mu m^{-1}$ to 100 $\mu m^{-1}$ of not more than 17 $nm^4$.

On the surface of the phase shift film 24 of the reflective mask blank 30 of the present disclosure, by making Rms to not be more than 0.50 nm (may be not more than 0.45 nm, may be not more than 0.40 nm, and even may be not more than 0.36 nm), and making the power spectrum density, which is the amplitude intensity of all roughness components detectable in a 1 μm×1 μm region at a spatial frequency of 10 $\mu m^{-1}$ to 100 $\mu m^{-1}$, to not be more than 17 $nm^4$ (may be not more than 10 $nm^4$), the phase shift film 24 can be obtained that has high absolute reflectance within a prescribed range for which there is a small difference (shift) from the design value in the case of having designed such that the absolute reflectance of the phase shift film with respect to UV light is within a high prescribed range. Consequently, the reflective mask 40 can be fabricated that is capable of obtaining high contrast at the edges of the phase shift film pattern 27.

In the method of manufacturing the reflective mask blank 30 of the present disclosure, in the forming the phase shift film 24, the phase shift film 24 is formed by reactive sputtering using a sputtering target composed of a material contained in the phase shift film 24, and the phase shift film 24 may be formed so that a component contained in the atmospheric gas during reactive sputtering is contained therein. The root mean square roughness (Rms) on the surface of the phase shift film 24 and the power spectrum density, which is the amplitude intensity of all roughness components detectable in a 1 μm×1 μm region at a spatial frequency of 10 $\mu m^{-1}$ to 100 $\mu m^{-1}$, can be adjusted so as to be within the ranges of prescribed values by adjusting the flow rate of atmospheric gas during deposition by reactive sputtering.

In the case of forming the phase shift film 24 by reactive sputtering, the atmospheric gas may be a mixed gas containing an inert gas and nitrogen gas. In this case, since the flow rate of nitrogen can be adjusted, the phase shift film 24 can be obtained having a suitable composition. As a result, the phase shift film 24 that has a suitable root mean square roughness (Rms) and power spectrum density can be reliably obtained on the surface thereof. For example, in the case the phase shift film 24 is composed of a TaN layer and CrOCN layer, the phase shift film 24 having a suitable root mean square roughness (Rms) and power spectrum density can be reliably obtained by adjusting the flow rate of nitrogen during deposition in both the cases of forming the TaN layer and forming the CrOCN layer.

In the method of manufacturing the reflective mask blank 30 of the present disclosure, the phase shift film 24 may be formed using a sputtering target of a material containing tantalum. As a result, the phase shift film 24 that contains tantalum and has suitable absorptance with respect to EUV light can be obtained.

The method of manufacturing the reflective mask blank 30 of the present disclosure may further comprise forming the protective film 22 arranged in contact with the surface of the multilayer reflective film 21. Since damage to the surface of the multilayer reflective film 21 can be inhibited when fabricating a transfer mask (EUV mask) by forming the protective film 22, reflectance properties with respect to EUV light can be further improved.

The protective film 22 may be formed by ion beam sputtering in which a sputtering target of the material of the protective film 22 is irradiated with an ion beam. Since smoothing of the protective film surface is obtained by ion beam sputtering, the surface of the phase shift film formed on the protective film and the surface of an etching mask film further formed on the phase shift film can be smoothened.

The method of manufacturing the reflective mask blank 30 of the present disclosure may further comprise forming the etching mask film 25 arranged in contact with the surface of the phase shift film 24. By forming the etching mask film 25 to have different dry etching properties than those of the phase shift film 24, a highly precise transfer pattern can be formed when forming a transfer pattern on the phase shift film 24.

[Reflective Mask 40]

Next, an explanation is provided of the reflective mask 40 according to one embodiment of the present disclosure.

Figure 4:
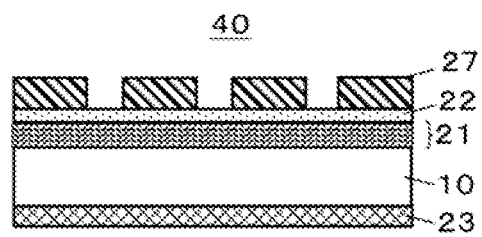
FIG. 4 is a cross-sectional schematic diagram showing one example of a reflective mask of one embodiment of the present disclosure.

FIG. 4 is a schematic diagram showing the reflective mask 40 of the present embodiment. The reflective mask 40 of the present disclosure employs a configuration in which the phase shift film pattern 27 is formed on the aforementioned multilayer reflective film 21 or the aforementioned protective film 22 by patterning the phase shift film 24 in the aforementioned reflective mask blank 30. When the reflective mask 40 of the present embodiment is exposed with exposure light such as EUV light, as a result of the exposure light being absorbed at the portion of the mask surface where the phase shift film 24 is present, and the exposure light being reflected by the exposed protective film 22 and the multilayer reflective film 21 at other portions where the phase shift film 24 has been removed, the reflective mask 40 of the present embodiment can be used as a reflective mask 40 for lithography. The reflective mask 40 of the present disclosure allows the obtaining of the phase shift film 24 that has high absolute reflectance within a prescribed range for which there is a small difference (shift) from the design value in the case of having designed such that the absolute reflectance of the phase shift film with respect to UV light is within a high prescribed range. Consequently, the reflective mask 40 of the present embodiment is capable of obtaining high contrast at the edges of the phase shift film pattern 27.

Patterning of the phase shift film 24 can be carried out in the following manner. Namely, a resist film pattern is first formed on the surface of the phase shift film 24. The phase shift pattern 24 is then etched and a phase shift film pattern is formed by carrying out dry etching with an etching gas using the resist film pattern as a mask. Examples of the etching gas used at this time include a chlorine-based gas such as $Cl_2$, $SiCl_4$, $CHCl_3$ or $CCl_4$, a mixed gas containing these chlorine-based gases and $O_2$ at a prescribed ratio, a mixed gas containing a chlorine-based gas and He at a prescribed ratio, a mixed gas containing a chlorine-based gas and Ar at a prescribed ratio, a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$ or F, a mixed gas containing these fluorine-based gases and $O_2$ at a prescribed ratio, and $O_2$ gas. In the case the phase shift film 24 is composed with a laminated structure consisting of a plurality of materials, etching can be carried out multiple times using etching gas suitable for each material.

Next, after having removed the resist film pattern with a resist stripping solution, wet cleaning is carried out using an acidic or alkaline aqueous solution to obtain the reflective mask 40 for EUV lithography that has achieved high reflectance. Furthermore, the resist film can be removed simultaneous to etching one of the layers in the laminated structure of the phase shift film 24 depending on the configuration of the phase shift film 24. In this case, only removing the resist film pattern is not required. In addition, in the case of providing the etching mask film 25, it may be necessary to provide a separate removal thereof.

Furthermore, as a result of the reflective mask blank 30 having the protective layer 22 on the multilayer reflective film 21, damage to the surface of the multilayer reflective film 21 can be inhibited when fabricating the reflective mask 40 (EUV mask). Consequently, the protective film 22 may be provided on the multilayer reflective film 21 in the reflective mask 40 as well. As a result, reflectance properties of the reflective mask 40 with respect to EUV light are improved.

The reflective mask 40 of the present may be such that the root mean square roughness (Rms), obtained by measuring a 1 μm×1 μm region on the surface of the multilayer reflective film 21 or the aforementioned protective layer 22 with an atomic force microscope, is not more than 0.15 nm, and power spectrum density at a spatial frequency of 10 to 100 $\mu m^{-1}$ is not more than 7 $nm^4$. As a result of making a prescribed root mean square roughness (Rms) and power spectrum density at a prescribed spatial frequency to be within prescribed ranges in a prescribed region of the multilayer reflective film 21 or the protective film 22 of the reflective mask 40, a phase shift film can be obtained that demonstrates higher absolute reflectance with respect to EUV light. Consequently, the use of the reflective mask 40 of the present disclosure makes it possible to increase the intensity of exposure light during exposure for manufacturing a semiconductor device. Consequently, throughput during manufacturing of a semiconductor device can be improved.

The reflective mask 40 of the present disclosure may be such that the difference between the power spectrum density of the surface of the aforementioned phase shift film pattern 27 and the power spectrum density on the surface of the aforementioned multilayer reflective film 21 or the aforementioned protective film 22 is not more than 10 $nm^4$. As a result of making the difference in prescribed power spectrum densities to be within a prescribed range, a reflective mask 40 capable of obtaining high contrast at the edges of the phase shift film pattern 27 can be more reliably obtained.

[Method of Manufacturing Semiconductor Device]

A semiconductor device, having various transfer patterns formed on a transferred substrate such as a semiconductor substrate, can be manufactured by transferring a transfer pattern, such as a circuit pattern based on the phase shift film pattern 27 of the reflective mask 40, to a resist film formed on a transferred substrate such as a semiconductor substrate by using the previously explained reflective mask 40 and a lithography process using an exposure apparatus, followed by going through various other processes.

According to the method of manufacturing a semiconductor device of the present disclosure, since the reflective mask 40 can be used that is capable of obtaining high contrast at the edges of a phase shift film pattern, a semiconductor device can be manufactured in which the dimensions of a circuit pattern or other transfer pattern transferred to a resist film formed on a transferred substrate such as a semiconductor substrate are accurate, and which has a fine and highly precise transfer pattern.

EXAMPLES

Next, an explanation is provided of examples of fabricating the reflective mask blank 30 and the reflective mask 40 according to the present embodiment.

First, the multilayer reflective film 21 and the phase shift film 24 were deposited on the surface of the mask blank substrate 10 for EUV exposure in the manner described below. Moreover, the back side electrically conductive film 23 was deposited on the back side of the mask blank substrate 10 to fabricate the reflective mask blank 30 of Examples 1 to 3 and Comparative Example 1. Thus, the reflective mask blank 30 of Examples 1 to 3 and Comparative Example 1 has a structure consisting of the back side electrically conductive film 23, mask blank substrate 10, multilayer reflective film 21, protective film 22 and phase shift film 24 in that order.

<Fabrication of Mask Blank Substrate 10>

An $SiO_2$—$TiO_2$-based glass substrate 10 having a size of 152 mm×152 mm and a thickness of 6.35 mm was prepared for use as the mask blank substrate 10, and the front and back surfaces of the glass substrate 10 were sequentially polished with cerium oxide abrasive particles and colloidal silica abrasive particles using a double-sided polishing apparatus followed by treating the surfaces with a low concentration of hydrofluorosilicic acid. Measurement of the surface roughness of the resulting glass substrate 10 surface with an atomic force microscope yielded a root mean square roughness (Rms) of 0.5 nm.

The surface morphology (surface form, flatness) and total thickness variation (TTV) of regions measuring 148 mm×148 mm on the front and back surfaces of the glass substrate 10 were measured with a wavelength-shifting interferometer using a wavelength-modulating laser. As a result, the flatness of the front and back surfaces of the glass substrate 10 was 290 nm (convex shape). The results of measuring the surface morphology (flatness) of the surface of the glass substrate 10 were stored in a computer in the form of height information with respect to a reference surface for each measurement point, compared with a reference value of 50 nm (convex shape) for the flatness of the front surface and a reference value of 50 nm for the flatness of the back side required by glass substrates, and the differences therewith (required removal amounts) were calculated by computer.

Next, processing conditions for local surface processing were set corresponding to the required removal amounts for each processing spot-shaped region on the surface of the glass substrate 10. A dummy substrate was used and preliminarily processed at a spot in the same manner as actual processing without moving the substrate for a fixed period of time. The morphology thereof was measured with the same measuring instrument as the apparatus used to measure the surface morphology of the aforementioned front and back surfaces, and the processing volume of the spot per unit time was calculated. The scanning speed during Raster scanning of the glass substrate 10 was then determined in accordance with the required removal amount obtained from the spot information and surface morphology information of the glass substrate 10.

Surface morphology was adjusted by carrying out local surface processing treatment in accordance with the set processing conditions by magnetorheological finishing (MRF) using a substrate finishing apparatus employing a magnetorheological fluid so that the flatness of the front and back surfaces of the glass substrate 10 was not more than the aforementioned reference values. Furthermore, the magnetorheological fluid used at this time contained an iron component, and the polishing slurry used an alkaline aqueous solution containing about 2% by weight of an abrasive in the form of cerium oxide. Subsequently, the glass substrate 10 was immersed in a cleaning tank containing an aqueous hydrochloric acid solution having a concentration of about 10% (temperature: about 25° C.) for about 10 minutes followed by rinsing with pure water and drying with isopropyl alcohol (IPA).

Furthermore, the local processing method employed for the mask blank substrate 10 in the present disclosure is not limited to the aforementioned magnetorheological finishing. A processing method using gas cluster ion beams (GCIB) or localized plasma may also be used.

Subsequently, surface processing by catalyst-referred etching (CARE) was carried out after carrying out double-sided touch polishing using colloidal silica abrasive particles as the finishing polishing of local surface processing treatment for the purpose of improving surface roughness. This CARE was carried out under the processing conditions indicated below.

Machining fluid: Pure water
Catalyst: Platinum
Substrate rotating speed: 10.3 rpm
Catalyst surface plate rotating speed: 10 rpm
Processing time: 50 minutes
Processing pressure: 250 hPa Subsequently, after scrubbing the edge faces of the glass substrate 10, the glass substrate 10 was immersed in a cleaning tank containing aqua regia (temperature: about 65° C.) for about 10 minutes. Subsequently, the glass substrate 10 was rinsed with pure water and dried. Furthermore, cleaning with aqua regia was carried out several times until there was no longer any Pt catalyst residue on the front and back surfaces of the glass substrate 10.

When a 1 μm×1 μm region at an arbitrary location of the transfer pattern formation region (132 mm×132 mm) on a main surface of the mask blank substrate 10 for EUV exposure obtained in the manner described above was measured with an atomic force microscope, root mean square roughness (Rms) was 0.040 nm and maximum height (Rmax) was 0.40 nm.

The power spectrum density at a spatial frequency of 1 $\mu m^{-1}$ to 10 $\mu m^{-1}$ obtained by measuring a 1 μm×1 μm region on a main surface of the mask blank substrate 10 for EUV exposure obtained in the manner described above with an atomic force microscope was a maximum of 5.29 $nm^4$ and a minimum of 1.15 $nm^4$. In addition, the power spectrum density at a spatial frequency of 10 $\mu m^{-1}$ to 100 $\mu m^{-1}$ was a maximum of 1.18 $nm^4$ and a minimum of 0.20 $nm^4$.

Examples 1 to 3 and Comparative Example 1

The multilayer reflective film 21 was formed on the previously described glass substrate 10 by alternately laminating an Mo layer (low refractive index layer, thickness: 2.8 nm) and an Si layer (high refractive index layer, thickness: 4.2 nm) (for a total of 40 laminated pairs) by ion beam sputtering using an Mo target and Si target, followed by finally depositing an Si layer at a thickness of 4.0 nm. When depositing the multilayer reflective film 21 by ion beam sputtering, the incident angle of sputtered Mo and Si particles relative to the normal of a main surface of the glass substrate 10 in ion beam sputtering was 30 degrees and the ion source gas flow rate was 8 sccm.

After depositing the multilayer reflective film 21, an Ru protective film 22 (film thickness: 2.5 nm) was deposited by ion beam sputtering on the multilayer reflective film 21 in continuation therefrom to obtain the substrate with a multilayer reflective film 20. When depositing the Ru protective film 22 by ion beam sputtering, the incident angle of sputtered Ru particles relative to the normal of a main surface of the substrate was 40 degrees and the ion source gas flow rate was 8 sccm.

Next, the phase shift film 24 was deposited on a main surface of the previously described mask blank substrate 10 by DC magnetron sputtering. In the case of Examples 1 to 3 and Comparative Example 1, a laminated film composed of two layers consisting of a TaN layer and CrOCN layer was used for the phase shift film 24 as shown in Table 1.

The phase shift films 24 of Examples 1 to 3 and Comparative Example 1 were formed by laminating TaN layers (tantalum-based material layer) and CrCON layers (chromium-based material layer) by DC sputtering. In addition, following deposition, elementary compositions of the TaN layers and CrCON layers were measured by X-ray photoelectron spectroscopy (XPS). The TaN layers (Ta: 92.5 at %, N: 7.5 at %) were formed at the prescribed film thicknesses shown in Table 1 by reactive sputtering in a mixed gas atmosphere of Ar gas and $N_2$ gas using a tantalum target. The CrCON layers (Cr: 45 at %, C: 10 at %, O: 35 at %, N: 10 at %) were formed at the prescribed film thicknesses shown in Table 1 by reactive sputtering in a mixed gas atmosphere of Ar gas, $CO_2$ gas and $N_2$ gas using a chromium target (deposition was carried out continuously from formation of the TaN film to formation of the CrOCN film without exposing to air). Furthermore, deposition pressure during deposition of the TaN films of Examples 1 to 3 was 0.08 Pa. In addition, deposition pressure during deposition of the TaN film of Comparative Example 1 was higher than in the case of Examples 1 to 3 at 0.12 Pa. In addition, deposition pressure of the CrOCN films of Examples 1 to 3 and Comparative Example 1 was 0.12 Pa.

The refractive indices n and extinction coefficients k of the TaN layer and CrCON layer composing the phase shift film 24 formed in the manner described above at a wavelength of 13.5 nm were respectively as indicated below.

TaN layer: n=0.94, k=0.034
CrCON layer: n=0.93, k=0.037

Furthermore, the aforementioned film thicknesses of the TaN layer and CrCON layer were set so that the absolute reflectance of the phase shift film 24 at a wavelength of 13.5 nm was 2.4% to 2.8% and the phase difference was 180 degrees.

Next, the reflective mask blanks 30 of Examples 1 to 3 and Comparative Example 1 were fabricated by depositing the back side electrically conductive film 23 on the back side of the mask blank substrate 10.

The back side electrically conductive film 23 was formed in the following manner. Namely, the back side electrically conductive film 23 was formed by DC magnetron sputtering on the back side of the substrate with a multilayer reflective film 20 used in Examples 1 to 3 and Comparative Example 1 where the multilayer reflective film 21 was not formed. The back side electrically conductive film 23 was formed by positioning a Cr target in opposition to the back side of the substrate with a multilayer reflective film 20 and carrying out reactive sputtering in an atmosphere consisting of a mixture of Ar and $N_2$ gas (Ar:$N_2$=90%:10%). Measurement of the elementary composition of the back side electrically conductive film 23 by Rutherford back scattering analysis yielded values of 90 at % for Cr and 10 at % for N. In addition, the film thickness of the back side electrically conductive film 23 was 20 nm. The reflective mask blanks 30 of Examples 1 to 3 and Comparative Example 1 were fabricated in the manner described above.

The surfaces of the phase shift films 24 of the mask blank substrates 10 for EUV exposure obtained in Examples 1 to 3 and Comparative Example 1 were measured for a 1 µm×1 µm region at an arbitrary location of the transfer pattern formation region (132 mm×132 mm) (and more specifically, in the center of the transfer pattern formation region) with an atomic force microscope. Table 1 indicates surface roughness obtained by measuring with an atomic force microscope (root mean square roughness, Rms) and the maximum values and integrated values of power spectrum density at a spatial frequency of 10 to 100 $\mu m^{-1}$ as determined by power spectrum analysis of surface roughness.

Figure 6:
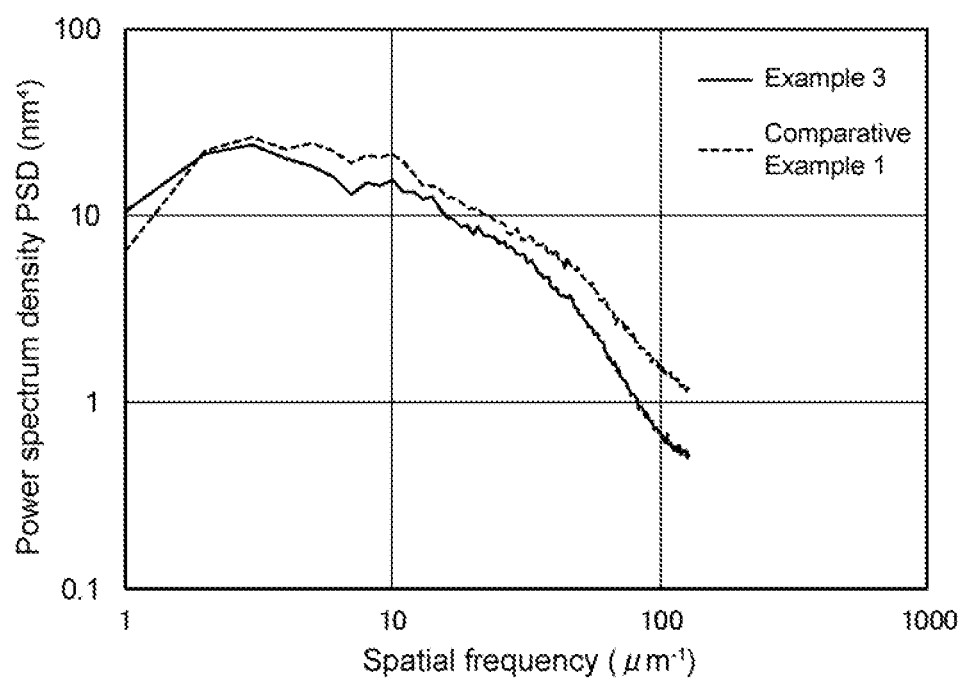
FIG. 6 is a graph indicating the results of analyzing the power spectra of the surfaces of phase shift films of reflective mask blanks of Example 3 and Comparative Example 1 of the present disclosure.

For reference purposes, FIG. 6 indicates the results of analyzing the power spectra of Example 3 and Comparative Example 1. As shown in FIG. 6, the power spectrum density at a spatial frequency of 10 $\mu m^{-1}$ to 100 $\mu m^{-1}$ obtained by measuring a 1 µm×1 µm region on the surface of the phase shift film 24 of Example 3 with an atomic force microscope demonstrated a maximum value of 15.56 $nm^4$ and a minimum value of 0.69 $nm^4$. On the other hand, as is also shown in FIG. 6, the power spectrum density at a spatial frequency of 10 $\mu m^{-1}$ to 100 $\mu m^{-1}$ obtained by measuring a 1 µm×1 µm region on the surface of the phase shift film 24 of Comparative Example 1 with an atomic force microscope demonstrated a maximum value of 21.63 $nm^4$ and a minimum value of 1.52 $nm^4$.

TABLE 1

|  | Example 1 | Example 2 | Example 3 | Comparative Example 1 |
|---|---|---|---|---|
| Structure of phase shift film | TaN/CrOCN | TaN/CrOCN | TaN/CrOCN | TaN/CrOCN |
| CrOCN film thickness (nm) | 5 | 10 | 25 | 25 |
| TaN film thickness (nm) | 54.3 | 48.9 | 33.4 | 33.4 |
| TaN film deposition pressure (Pa) | 0.08 | 0.08 | 0.08 | 0.12 |
| Surface roughness of surface of phase shift film of reflective mask blank (root mean square roughness Rms) (nm) | 0.242 | 0.236 | 0.355 | 0.447 |
| Maximum value of PSD at spatial frequency of 10 to 100 $\mu m^{-1}$ of surface of phase shift film of reflective mask blank ($nm^4$) | 9.16 | 9.68 | 15.56 | 21.63 |
| Integrated value of PSD at spatial frequency of 10 to 100 $\mu m^{-1}$ of surface of phase shift film of reflective mask blank ($nm^3$) | 238.17 | 236.87 | 351.38 | 507.82 |
| (A) Maximum value of PSD at spatial frequency of 10 to 100 $\mu m^{-1}$ of surface of phase shift film after fabricating reflective mask blank ($nm^4$) | 9.16 | 9.68 | 15.56 | 21.63 |
| (B) Maximum value of PSD at spatial frequency of 10 to 100 $\mu m^{-1}$ of surface of multilayer reflective film (with protective film) after fabricating reflective mask blank ($nm^4$) | 6.46 | 6.46 | 6.46 | 6.46 |
| Difference between maximum PSD values (A) and (B) (A − B, $nm^4$) | 2.7 | 3.22 | 9.1 | 15.17 |
| Design value of absolute reflectance $R_{PSM}$ surface of phase shift film of reflective mask blank | 2.4% | 2.7% | 2.8% | 2.8% |
| Measured value of absolute reflectance $R_{PSM}$ of surface of phase shift film of reflective mask blank (figures in parentheses indicate shift from design value) | 2.4% (0%) | 2.5% (−0.2%) | 2.0% (−0.8%) | 1.7% (−1.1%) |
| Measured value of absolute reflectance $R_{PSM}$ of surface of phase shift film after fabricating reflective mask | 2.4% | 2.5% | 2.0% | 1.7% |

As indicated in Table 1, the root mean square roughness (Rms) obtained by measuring a 1 µm×1 µm region on the surface of the phase shift film 24 of Examples 1 to 3 with an atomic force microscope was not more than 0.50 nm. On the other hand, the root mean square roughness (Rms) obtained by measuring a 1 μm×1 μm region on the surface of the phase shift film 24 of Comparative Example 1 with an atomic force microscope was 0.447 nm.

As indicated in Table 1, the maximum value of power spectrum density at a spatial frequency of 10 μm$^{-1}$ to 100 μm$^{-1}$ of the surface of the phase shift film 24 in Examples 1 to 3 was not more than 17 nm$^4$. On the other hand, the maximum value of power spectrum density at a spatial frequency of 10 μm$^{-1}$ to 100 μm$^{-1}$ of the surface of the phase shift film 24 of Comparative Example 1 was greater than 17 nm$^4$ at 21.63 nm$^4$.

Table 1 indicates (A) power spectrum density (PSD) on the surface of the phase shift film and (B) power spectrum density (PSD) on the surface of the multilayer reflective film (with protective film) after fabricating the reflective mask in Examples 1 to 3 and Comparative Example 1, along with the difference between (A) and (B) (A-B). The difference between (A) and (B) (A-B) in Examples 1 to 3 was not more than 10 nm$^4$. In contrast, the difference between (A) and (B) (A-B) in Comparative Example 1 was greater than 10 nm$^4$ at 15.17 nm$^4$.

In addition, the root mean square roughness Rms on the surface of the multilayer reflective films (with protective film) of Examples 1 to 3 was not more than 0.15 nm at 0.138 nm. The maximum value of PSD at a spatial frequency of 10 μm$^{-1}$ to 100 μm$^{-1}$ of the surface of the multilayer reflective films (with protective film) of Examples 1 to 3 and Comparative Example 1 was not more than 7 nm$^4$ at 6.46 nm$^4$.

Table 1 indicates the design values and measured values of absolute reflectance $R_{PSM}$ of the phase shift film 24 in Examples 1 to 3 and Comparative Example 1 along with the difference (shift) between the measured values and design values. Absolute reflectance $R_{PSM}$ of the phase shift film 24 was measured using an EUV reflectance measurement apparatus (LPR-1016). At this time, EUV light having a wavelength of 13.5 nm was used for the light used to measure absolute reflectance. Furthermore, absolute reflectance $R_{ML}$ on the surface of the multilayer reflective film was 65%. As is clear from Table 1, absolute reflectance $R_{PSM}$ of the phase shift film 24 in Examples 1 to 3 was high at not less than 2.0%, while the difference between the design values and measured values of absolute reflectance $R_{PSM}$ was small at not more than 1.0% (0% to 0.8%). In contrast, absolute reflectance $R_{PSM}$ of the phase shift film 24 in Comparative Example 1 was low at not more than 1.7%, while the difference (shift) between the design value and measured value of absolute reflectance $R_{PSM}$ was comparatively large at −1.1%. Thus, the absolute reflectance with respect to EUV light of the mask blanks of Examples 1 to 3 was clearly determined to be high while the shift from the design value was small.

<Fabrication of Reflective Mask 40>

The surface of the phase shift film 24 of the reflective mask blanks 30 of Examples 1 to 3 and Comparative Example 1 were coated with resist by spin coating and a resist film having a film thickness of 150 nm was deposited thereon after going through heating and cooling. Next, a resist pattern was formed by going through desired pattern drawing and developing. The phase shift film pattern 27 was formed on the protective film 22 by patterning the phase shift film 24 by prescribed dry etching using the resist pattern as a mask. Furthermore, the phase shift film 24 in the form of a laminated film composed of two layers consisting of a TaN layer and CrOCN layer can be dry etched with a mixed gas of chlorine (Cl$_2$) and oxygen (O$_2$) (mixing ratio (flow rate ratio) of chlorine (Cl$_2$) to oxygen (O$_2$)=4:1).

Subsequently, the resist film was removed followed by chemical cleaning in the same manner as previously described to fabricate the reflective masks 40 of Examples 1 to 3 and Comparative Example 1.

<Method of Manufacturing Semiconductor Device>

When semiconductor devices were fabricated using the reflective masks 40 of the aforementioned Examples 1 to 3 and Comparative Example 1 and pattern transfer was carried out on a resist film on a transferred substrate in the form of a semiconductor substrate using an exposure apparatus followed by patterning an interconnection layer, semiconductor devices were able to be fabricated in which dimensions of the transfer pattern were accurate due to obtaining high contrast at the edges of the phase shift film pattern of the reflective mask.

Furthermore, in fabricating the previously described substrate with a multilayer reflective film 20 and the reflective mask blank 30, although the multilayer reflective film 21 and the protective film 22 were deposited on a main surface of the mask blank substrate 10 on the side where a transfer pattern is formed followed by forming the back side electrically conductive film 23 on the opposite side from the aforementioned main surface, fabrication is not limited thereto. The reflective mask blank 30 may also be fabricated by forming the back side electrically conductive film 23 on a main surface of the mask blank substrate 10 on the opposite side from the main surface on the side on which a transfer pattern is formed, followed by depositing the multilayer reflective film 21 and the protective film 22 on the main surface on the side where the transfer pattern is formed, and finally further depositing the phase shift film 24 on the protective film 22.

BRIEF DESCRIPTION OF THE REFERENCE SYMBOLS

10 Mask blank substrate
20 Substrate with a multilayer reflective film
21 Multilayer reflective film
22 Protective film
23 Back side electrically conductive film
24 Phase shift film
25 Etching mask film
26 Mask blank multilayer film
27 Phase shift film pattern
30 Reflective mask blank
40 Reflective mask

The invention claimed is:

1. A reflective mask blank comprising:
a multilayer reflective film; and
a phase shift film that shifts the phase of EUV light formed in that order on a substrate; wherein,
root mean square roughness (Rms), obtained by measuring a 1 μm×1 μm region on the surface of the phase shift film with an atomic force microscope, is not more than 0.50 nm, and power spectrum density at a spatial frequency of 10 to 100 μm$^{-1}$ is not more than 17 nm$^4$.

2. The reflective mask blank according to claim 1, wherein a protective film is formed on the multilayer reflective film.

3. The reflective mask blank according to claim 1, wherein the phase shift film has a tantalum-based material layer comprising tantalum and nitrogen and a chromium-based material layer comprising chromium and nitrogen on the tantalum-based material layer.

4. The reflective mask blank according to claim 3, wherein the film thickness of the chromium-based material layer is 5 to 30 nm.

5. The reflective mask blank according to claim 2, wherein the phase shift film has a tantalum-based material layer comprising tantalum and nitrogen and a chromium-based material layer comprising chromium and nitrogen on the tantalum-based material layer.

6. The reflective mask blank according to claim 5, wherein the film thickness of the chromium-based material layer is 5 to 30 nm.

7. A reflective mask comprising:
a multilayer reflective film; and
a phase shift film pattern that shifts the phase of EUV light formed in that order on a substrate; wherein,
root mean square roughness (Rms), obtained by measuring a 1 μm×1 μm region on the surface of the phase shift film pattern with an atomic force microscope, is not more than 0.50 nm, and power spectrum density at a spatial frequency of 10 to 100 μm$^{-1}$ is not more than 17 nm$^4$.

8. The reflective mask according to claim 7, wherein a protective film is formed on the multilayer reflective film.

9. The reflective mask according to claim 7, wherein root mean square roughness (Rms), obtained by measuring a 1 μm×1 μm region on the surface of the multilayer reflective film with an atomic force microscope, is not more than 0.15 nm, and power spectrum density at a spatial frequency of 10 to 100 μm$^{-1}$ is not more than 7 nm$^4$.

10. The reflective mask according to claim 7, wherein the difference between the power spectrum density on the surface of the phase shift film pattern and power spectrum density on the surface of the multilayer reflective film is not more than 10 nm$^4$.

11. The reflective mask according to claim 8, wherein root mean square roughness (Rms), obtained by measuring a 1 μm×1 μm region on the surface of the protective film with an atomic force microscope, is not more than 0.15 nm, and power spectrum density at a spatial frequency of 10 to 100 μm$^{-1}$ is not more than 7 nm$^4$.

12. The reflective mask according to claim 8, wherein the difference between the power spectrum density on the surface of the phase shift film pattern and power spectrum density on the surface of the protective film is not more than 10 nm$^4$.

13. The reflective mask according to claim 8, wherein root mean square roughness (Rms), obtained by measuring a 1 μm×1 μm region on the surface of the multilayer reflective film with an atomic force microscope, is not more than 0.15 nm, and power spectrum density at a spatial frequency of 10 to 100 μm$^{-1}$ is not more than 7 nm$^4$.

14. The reflective mask according to claim 8, wherein the difference between the power spectrum density on the surface of the phase shift film pattern and power spectrum density on the surface of the multilayer reflective film is not more than 10 nm$^4$.

15. The reflective mask according to claim 9, wherein the difference between the power spectrum density on the surface of the phase shift film pattern and power spectrum density on the surface of the multilayer reflective film is not more than 10 nm$^4$.

16. A method of manufacturing a semiconductor device comprising:
carrying out a lithography process using an exposure device using a reflective mask to form a transfer pattern on a transferred substrate, the reflective mask comprising:
a multilayer reflective film; and
a phase shift film pattern that shifts the phase of EUV light formed in that order on a substrate; wherein,
root mean square roughness (Rms), obtained by measuring a 1 μm×1 μm region on the surface of the phase shift film pattern with an atomic force microscope, is not more than 0.50 nm, and power spectrum density at a spatial frequency of 10 to 100 μm$^{-1}$ is not more than 17 nm$^4$.

17. The method of claim 16, wherein a protective film is formed on the multilayer reflective film.

18. The method of claim 16, wherein root mean square roughness (Rms), obtained by measuring a 1 μm×1 μm region on the surface of the multilayer reflective film with an atomic force microscope, is not more than 0.15 nm, and power spectrum density at a spatial frequency of 10 to 100 μm$^{-1}$ is not more than 7 nm$^4$.

19. The method of claim 16, wherein the difference between the power spectrum density on the surface of the phase shift film pattern and power spectrum density on the surface of the multilayer reflective film is not more than 10 nm$^4$.

* * * * *